US006219387B1

(12) United States Patent
Glover

(10) Patent No.: US 6,219,387 B1
(45) Date of Patent: Apr. 17, 2001

(54) METRIC CIRCUIT AND METHOD FOR USE IN A VITERBI DETECTOR

(75) Inventor: Kerry C. Glover, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/819,984

(22) Filed: Mar. 18, 1997

Related U.S. Application Data

(60) Provisional application No. 60/014,859, filed on Apr. 4, 1996.

(51) Int. Cl.[7] .................................................. H03D 1/00
(52) U.S. Cl. ......................... 375/341; 371/43.8; 371/49.3
(58) Field of Search .................................... 375/340, 341, 375/262, 263, 265; 371/43.4, 43.7, 43.6, 43.8, 49.3

(56) References Cited

U.S. PATENT DOCUMENTS

| 5,214,319 | * | 5/1993 | Abdi ..................................... 307/351 |
| 5,341,249 | * | 8/1994 | Abbott et al. ........................... 360/46 |
| 5,373,400 | * | 12/1994 | Kovacs ................................... 360/46 |
| 5,408,503 | * | 4/1995 | Kahlman ............................... 375/340 |
| 5,430,768 | * | 7/1995 | Minuhin et al. ...................... 375/340 |
| 5,459,757 | * | 10/1995 | Minuhin et al. ...................... 375/376 |
| 5,659,309 | * | 8/1997 | Takashi et al. ......................... 341/50 |

OTHER PUBLICATIONS

Michael Melas, Patrick Arnett, and Jaekyun Moon, "Noise in a Thin Metallic Medium: The Connection with Nonlinear Behaviour," *IEEE Transactions on Magnetics*, vol. 24, No. 6, Nov. 1988, pp. 2712–2714.*

Jaekyun J. Moon and L. Richard Carley, "Partial Response Signaling in a Magnetic Recording Channel," *IEEE Transactions on Magnetics*, vol. 24, No. 6, Nov. 1988, pp. 2973–2975.*

F. Dollvo, R. Hermann, and S. Olcer, "Performance and Sensitivity Analysis of Maximum–Likelihood Sequence Detection on Magnetic Recording Channels," *IEEE Transactions on Magnetics*, vol. 25, No. 5, Sep. 1989, pp. 4072–4074.*

Yinyi Lin and Jack K. Wolf, "Combined ECC/RLL Codes," *IEEE Transactions on Magnetics*, vol. 24, No. 6, Nov. 1988, pp. 2527–2529.*

(List continued on next page.)

*Primary Examiner*—Chi H. Pham
*Assistant Examiner*—Emmanuel Baynard
(74) *Attorney, Agent, or Firm*—W. Daniel Swayze, Jr.; W. James Brady; Frederick J. Telecky, Jr.

(57) ABSTRACT

A metric circuit (53) and method for use in a viterbi detector (54) are provided. The metric circuit (53) provides a transition signal (56) to a trellis block (55) during a first period and a second period. The transition signal (56) includes a negative transition signal and a positive transition signal. The metric circuit (53) includes a first adder circuit (70), a second adder circuit (72), a first comparator (74), a second comparator (76), an odd sample/hold circuit (80), and an even sample/hold circuit (82). The metric circuit (53) receives a discrete signal and a threshold value at the first adder circuit (70) and the second adder circuit (72). The first is adder circuit (70) generates a first sum and the second adder circuit (72) generates a second sum. The first comparator (74) compares the first sum to an odd metric value, stored in the odd sample/hold circuit (80), during the first period, and compares the first sum to an even metric value, stored in the even sample/hold circuit (82), during the second period. The second comparator (76) compares the second sum to the odd metric value during the first period, and compares the second sum to the even metric value during the second period. The value of the odd metric value and the even metric value are replaced with either the first sum or the second sum only when specified conditions are met.

17 Claims, 2 Drawing Sheets

OTHER PUBLICATIONS

Catherine A. French, Anthony D. Weathers, and Jack Keil Wolf, "A Generalized Scheme for Generating and Detecting Recording Channel Output Waveforms with Controlled Pulse Polarity," *IEEE Transactions on Magnetics*, vol. 24, No. 6, Nov. 1988, pp. 2530–2532.*

Richard C. Schneider, "Write Equalization for Generalized (d,k) Codes," *IEEE Transactions on Magnetics*, vol. 24, No. 6, Nov. 1988, pp. 2533–2535.*

Dean Palmer, Pablo Ziperovich, Roger Wood, and Thomas D. Howell, "Identification of Nonlinear Write Effects Using Pseudorandom Sequences," *IEEE Transactions on Magnetics*, vol. MAG–23, No. 5, Sep. 1987, pp. 2377–2379.*

Roger Wood, "Jitter vs. Additive Noise in Magnetic Recording: Effects on Detection," *IEEE Transactions on Magnetics*, vol. MAG–23, No. 5, Sep. 1987, pp. 2683–2685.*

H.K. Thapar and A.M. Patel, "A Class of Partial Response Systems for Increasing Storage Density in Magnetic Recording," *IEEE Transactions on Magnetics*, vol. MAG–23, No. 5, Sep. 1987, pp. 3666–3668.*

Roger W. Wood and David A. Petersen, "Viterbi Detection of Class IV Partial Response on a Magnetic Recording Channel," *IEEE Transactions on Communications*, vol. COM–34, No. 5, May 1986, pp. 454–461.*

Yaw–Shing Tang, "Noise Autocorrelation in High Density Recording on Metal Film Disks," *IEEE Transactions on Magnetics*, vol. MAG–22, No. 5, Sep. 1986, pp. 883–885.*

C. Michael Melas, Patrick Arnett, Irene Beardsley, and Dean Palmer, "Nonlinear Superposition in Saturation Recording of Disk Media," *IEEE Transactions on Magnetics*, vol. MAG–23, No. 5, Sep. 1987, pp. 2079–2081.*

R.A. Baugh, E.S. Murdock, and B.R. Natarajan, "Measurement of Noise in Magnetic Media," *IEEE Transactions on Magnetics*, vol. MAG–19, No. 5, Sep. 1983, pp. 1722–1724.*

Hans Burkhardt and Lineu C. Barbosa, "Contributions to the Application of the Viterbi Algorithm," *IEEE Transactions on Information Theory*, vol. IT–31, No. 5, Sep. 1985, pp. 626–634.*

Yaw–Shing Tang, "Noise Autocorrelation in Magnetic Recording Systems," *IEEE Transactions on Magnetics*, vol. MAG–21, No. 5, Sep. 1985, pp. 1389–1394.*

Gottfried Ungerboeck, "Adaptive Maximum–Likelihood Receiver for Carrier–Modulated Data–Transmission Systems," *IEEE Transactions on Communications*, vol. Com–22, No. 5, May 1974, pp. 624–636.*

Peter Kabal and Subbarayan Pasupathy, "Partial–Response Signaling," *IEEE Transactions on Communications*, vol. Com–23, No. 9, Sep. 1975, pp. 921–934.*

C.T. Beare, "The Choice of the Desired Impulse Response in Combined Linear–Viterbi Algorithm Equalizers," *IEEE Transactions on Communications*, vol. Com–26, No. 8, Aug. 1978, pp. 1301–1307.*

Kenneth Abend and Bruce D. Fritchman, "Statistical Detection for Communication Channels with Intersymbol Interference," *Proceedings of the IEEE*, vol. 58, No. 5, May 1970, pp. 779–785.*

G. David Forney, Jr., "Maximum–Likelihood Sequence Estimation of Digital Sequences in the Presence of Intersymbol Interference," *IEEE Transactions on Information Theory*, vol. IT–18, No. 3, May 1972, pp. 363–378.*

G. David Forney, Jr., "The Viterbi Algorithm," *Proceedings of the IEEE*, vol. 61, No. 3, Mar. 1973, pp. 268–278.*

Richard C. Schneider, "Sequence (Viterbi–Equivalent) Decoding," *IEEE Transactions on Magnetics*, vol. 24, No. 6, Nov. 1988, pp. 2539–2541.*

J.D. Coker, R.L. Galbraith, G.J. Kerwin, J.W. Rae, P.A. Ziperovich, "Implementation of PRML in a Rigid Disk Drive," *IEEE Transactions on Magnetics*, vol. 27, No. 6, Nov. 1991, pp. 4538–4543.*

H. Kobayashi and D.T. Tang, "Application of Partial–response Channel Coding to Magnetic Recording Systems," *IBM J. Res. Develop.*, Jul. 1970, pp. 368–375.*

Roger Wood, "New Detector for 1,k Codes Equalized to Class II Partial Response," *IEEE Transactions on Magnetics*, vol. 25, No. 5, Sep. 1989, pp. 4075–4077.*

J.W.M. Bergmans, S. Mita, and M. Izumita, "Characterization of Digital Recording Channels by Means of Echo Cancellation Techniques," *IEEE Transactions on Magnetics*, vol. 25, No. 5, Sep. 1989, pp. 4078–4080.*

Yinyi Lin, "An Estimation Technique for Accurately Modelling the Magnetic Recording Channel Including Nonlinearities," *IEEE Transactions on Magnetics*, vol. 25, No. 5, Sep. 1989, pp. 4084–4086.*

Lyle J. Fredrickson, "Viterbi Detection of Matched Spectral Null Codes for PR4 Systems," *IEEE Transactions on Magnetics*, vol. 28, No. 5, Sep. 1992, pp. 2889–2891.*

Chopra and D.D. Woods, "A Maximum Likelihood Peak Detecting Channel," *IEEE Transactions on Magnetics*, vol. 27, No. 6, Nov. 1991, pp. 4819–4821.*

Arvind M. Patel, "A New Digital Signal Processing Channel for Data Storage Products," *IEEE Transactions on Magnetics*, vol. 27, No. 6, Nov. 1991, pp. 4579–4584.*

Anthony D. Weathers, Catherine A. French, and Jack Keil Wolf, "Results on 'Controlled Polarity' Modulation and Coding," *IEEE Transactions on Magnetics*, vol. 25, No. 5, Sep. 1989, pp. 4090–4092.*

Catherine A. French, "Distance Preserving Rung–Length Limited Codes," *IEEE Transactions on Magnetics*, vol. 25, No. 5, Sep. 1989, pp. 4093–4095.*

Lyle J. Fredrickson and Jack Keil Wolf, "Error Detecting Multiple Block (d,k) Codes," *IEEE Transactions on Magnetics*, vol. 25, No. 5, Sep. 1989, pp. 4096–4098.*

Roger Wood, "Enhanced Decision Feedback Equalization," *IEEE Transactions on Magnetics*, vol. 26, No. 5, Sep. 1990, pp. 2178–2180.*

Thomas D. Howell, Donald P. McCown, Thomas A. Diola, Yaw–shing Tang, Karl R. Hense, Ralph L. Gee, "Error Rate Performance of Experimental Gigabit Per Square Inch Recording Components," *IEEE Transactions on Magnetics*, vol. 26, No. 5, Sep. 1990, pp. 2298–2302.*

Pantas Sutardja, "A Post–Compensation Scheme for Peak-–Detect Channel," *IEEE Transactions on Magnetics*, vol. 26, No. 5, Sep. 1990, pp. 2303–2305.*

L.L. Nunnelley, M.A. Burleson, L.L. Williams, and I.A. Beardsley, "Analysis of Asymmetric Deterministic Bitshift Errors in a Hard Disk File," *IEEE Transactions on Magnetics*, vol. 26, No. 5, Sep. 1990, pp. 2306–2308.*

H.K. Thapar, N.P. Sands, W.L. Abbott, and J.M. Cioffi, "Spectral Shaping for Peak Detection Equalization," *IEEE Transactions on Magnetics*, vol. 26, No. 5, Sep. 1990, pp. 2309–2311.*

Lyle J. Fredrickson, "Coding for Maximum Likelihood Detection on a Magnetic Recording Channel," *IEEE Transactions on Magnetics*, vol. 26, No. 5, Sep. 1990, pp. 2315–2317.*

R. Hermann, "Volterra Modeling of Digital Magnetic Saturation Recording Channels," *IEEE Transactions on Magnetics*, vol. 26, No. 5, Sep. 1990, pp. 2125–2127.*

Roger Wood, Mason Williams, and John Hong, "Considerations for High Data Rate Recording with Thin–Film Heads," *IEEE Transactions on Magnetics*, vol. 26, No. 6, Nov. 1990, pp. 2954–2959.*

Jaekyun Moon and L. Richard Carley, "Performance Comparison of Detection Methods in Magnetic Recording," *IEEE Transactions on Magnetics*, vol. 26, No. 6, Nov. 1990, pp. 3155–3172.*

William L. Abbott, John M. Cioffi, and Hemant K. Thapar, "Performance of Digital Magnetic Recording with Equalization and Offtrack Interference," *IEEE Transactions on Magnetics*, vol. 27, No. 1, Jan. 1991, pp. 705–716.*

Jan W.M. Bergmans, Seiichi Mita, and Morishi Izumita, "A Simulation Study of Adaptive Reception Schemes for High–Density Digital Magnetic Storage," *IEEE Transactions on Magnetics*, vol. 27, No. 1, Jan. 1991, pp. 717–723.*

Ching Tsang and Yaw–Shing Tang, "Time–Domain Study of Proximity–Effect Induced Transition Shifts," *IEEE Transactions on Magnetics*, vol. 27, No. 2, Mar. 1991, pp. 795–802.*

K.B. Klaassen, "Magnetic Recording Channel Front–Ends," *IEEE Transactions on Magnetics*, vol. 27, No. 6, Nov. 1991, pp. 4503–4508.*

John Hong, Roger Wood, David Chan, "An Experimental 180 Mb/sec PRML Channel for Magnetic Recording," *IEEE Transactions on Magnetics*, vol. 27, No. 6, Nov. 1991, pp. 4532–4537.*

Jonathan D. Coker, Richard L. Galbraith, and Gregory J. Kerwin, "Magnetic Characterization using Elements of a PRML Channel," *IEEE Transactions on Magnetics*, vol. 27, No. 6, Nov. 1991, pp. 4544–4548.*

L. Richard Carley and John G. Kenney, "Comparison of Computationally Efficient Forms of FDTS/DF Against PR4–ML," *IEEE Transactions on Magnetics*, vol. 27, No. 6, Nov. 1991, pp. 4567–4572.*

Jaekyun Moon, "Discrete–Time Modeling of Transition–Noise Dominant Channels and Study of Detection Performance," *IEEE Transactions on Magnetics*, vol. 27, No. 6, Nov. 1991, pp. 4573–4578.*

Jack Keil Wolf, "A Survey of Codes for Partial Response Channels," *IEEE Transactions on Magnetics*, vol. 27, No. 6, Nov. 1991, pp. 4585–4589.*

Norman L. Koren, "Matched Filter Limits and Code Performance in Digital Magnetic Recording," *IEEE Transactions on Magnetics*, vol. 27, No. 6, Nov. 1991, pp. 4594–4599.*

H.M. Hilden, D.G. Howe, and E.J. Weldon, Jr., "Shift Error Correcting Modulation Codes," *IEEE Transactions on Magnetics*, vol. 27, No. 6, Nov. 1991, pp. 4600–4605.*

Derek D. Kumar andd Bill J. Hunsinger, "ACT–enabled 100MHz Channel Equalizer," *IEEE Transactions on Magnetics*, vol. 27, No. 6, Nov. 1991, pp. 4799–4803.*

Alan J. Armstrong and Jack Keil Wolf, "Performance Evaluation of a New Coding Scheme for the Peak Detecting Magnetic Recording Channel," *IEEE Transactions on Magnetics*, vol. 27, No. 6, Nov. 1991, pp. 4804–4806.*

S. Raghavan and H.K. Thapar, "Feed–Forward Timing Recovery for Digital Magnetic Recording," *International Conference on Communications Conference Record*, vol. 2, 1991, pp. 794–798.*

S.A. Raghavan and H.K. Thapar, "On Feed–Forward and Feedback Timing Recovery for Digital Magnetic Recording Systems," *IEEE Transactions on Magnetics*, vol. 27, No. 6, Nov. 1991, pp. 4810–4812.*

James Fitzpatrick and Jack Keil Wolf, "A Maximum Likelihood Detector for Nonlinear Magnetic Recording," *IEEE Transactions on Magnetics*, vol. 27, No. 6, Nov. 1991, pp. 4816–4818.*

John G. Kenney, Peter Alexis McEwen, and L. Richard Carley, "Evaluation of Magnetic Recording Detection Schemes for Thin Film Media," *IEEE Transactions on Magnetics*, vol. 27, No. 6, Nov. 1991, pp. 4822–4824.*

Pablo A. Ziperovich, "Performance Degradation of PRML Channels Due to Nonlinear Distortions," *IEEE Transactions on Magnetics*, vol. 27, No. 6, Nov. 1991, pp. 4825–4827.*

Jaekyun Moon and Jian–Gang Zhu, "Nonlinear Effects of Transition Broadening," *IEEE Transactions on Magnetics*, vol. 27, No. 6, Nov. 1991, pp. 4831–4833.*

Jaekyun Moon, "Signal–to–Noise Ratio Degradation with Channel Mismatch," *IEEE Transactions on Magnetics*, vol. 27, No. 6, Nov. 1991, pp. 4837–4839.*

R.D. Barndt, A.J. Armstrong, H.N. Bertram, and J.K. Wolf, "A Simple Statistical Model of Partial Erasure in Thin Film Disk Recording Systems," *IEEE Transactions on Magnetics*, vol. 27, No. 6, Nov. 1991, pp. 4978–4980.*

Y. Tang and C. Tsang, "A Technique for Measuring Nonlinear Bit Shift," *IEEE Transactions on Magnetics*, vol. 27, No. 6, Nov. 1991, pp. 5316–5318.*

R.D. Barndt and J.K. Wolf, "Modeling and Signal Processing for the Nonlinear Thin Film Recording Channel," *IEEE Transactions on Magnetics*, vol. 28, No. 5, Sep. 1992, pp. 2710–2712.*

H. Thapar, J. Rae, C. Shung, R. Karabed, and P. Siegel, "On the Performance of a Rate 8/10 Matched Spectral Null Code for Class–4 Partial Response," *IEEE Transactions on Magnetics*, vol. 28, No. 5, Sep. 1992, pp. 2883–2888.*

Hamid Shafiee and Jaekyun Moon, "Low–Complexity Viterbi Detection for a Family of Partial Response Systems†," *IEEE Transactions on Magnetics*, vol. 28, No. 5, Sep. 1992, pp. 2892–2894.*

Weining Zeng and Jaekyun Moon, "Modified Viterbi Algorithm for a Jitter–dominant $1-D^2$ Channel," *IEEE Transactions on Magnetics*, vol. 28, No. 5, Sep. 1992, pp. 2895–2897.*

William E. Ryan, "Comparative Performance Between Drop–Out Detection and Viterbi Reliability Metric Erasure Flagging," *IEEE Transactions on Magnetics*, vol. 28, No. 5, Sep. 1992, pp. 2898–2900.*

C. Menyennett, L. Botha, and H.C. Ferreira, "A NewRunlength Limited Code for Binary Asymmetric Channels," *IEEE Transactions on Magnetics*, vol. 28, No. 5, Sep. 1992, pp. 2901–2903.*

Gang H. Lin, Rick Barndt, H. Neal Bertram, and Jack K. Wolf, "Experimental Studies on Nonlinearities in High Density Disk Recording," *IEEE Transactions on Magnetics*, vol. 28, No. 5, Sep. 1992, pp. 3279–3281.*

Ralph Simmons and Robert Davidson, "Media Design for User Density of up to 3 Bits per Pulse Width," *IEEE Transactions on Magnetics*, vol. 29, No. 1, Jan. 1993, pp. 169–176.*

Jaekyun Moon and Jian–Gang Zhu, "Nonlinearities in Thin-Film Media and Their Impact on Data Recovery," *IEEE Transactions on Magnetics,* vol. 29, No. 1, Jan. 1993, pp. 177–182.*

R.D. Barndt, A.J. Armstrong, and J.K. Wolf, "Media Selection for High Density Recording Channels," *IEEE Transactions on Magnetics,* vol. 29, No. 1, Jan. 1993, pp. 183–188.*

Dean C. Palmer and Jonathan D. Coker, "Media Design Considerations for a PRML Channel," *IEEE Transactions on Magnetics,* vol. 29, No. 1, Jan. 1993, pp. 189–194.*

Zadian Software, Inc., *Disk Drive Technology,* Copyright 1990, San Jose, CA.*

United States Patent Application for "System and Method for Reconstructing a Signal Wave in a Partial Response Read Channel," 32 pages of text and 8 figures. (Serial number and filing date is unknown).*

Roy D. Cideciyan, Francois, Dolivo, Reto Hermann, Walter Hirt, and Wolfgang Schott, "A PRML System for Digital Magnetic Recording," *IEEE Journal on Selected Areas in Communications,* vol. 10, No. 1, Jan. 1992, pp. 38–56.*

\* cited by examiner

US 6,219,387 B1

METRIC CIRCUIT AND METHOD FOR USE IN A VITERBI DETECTOR

This application claims priority under 35 USC 119(e)(1) provisional application No. 60/014,859, filed Apr. 4, 1996.

TECHNICAL FIELD OF THE INVENTION

This invention relates generally to the field of information storage and more particularly to a metric circuit and method for use in a viterbi detector.

BACKGROUND OF THE INVENTION

As computer hardware and software technology continues to progress, the need for larger and faster mass storage devices for storing computer software and data continues to increase. Electronic databases and computer applications such as multimedia applications require large amounts of disk storage space. An axiom in the computer industry is that there is no such thing as enough memory and disk storage space.

To meet these ever increasing demands, hard disk drives continue to evolve and advance. Some of the early disk drives had a maximum storage capacity of five megabytes and used fourteen inch platters, whereas today's hard disk drives are commonly over one gigabyte and use 3.5 inch platters. Correspondingly, advances in the amount of data stored per unit of area, or areal density, have dramatically accelerated. For example, in the 1980's, areal density increased about thirty percent per year while in the 1990's annual areal density increases have been around sixty percent. The cost per megabyte of a hard disk drive is inversely related to its areal density.

Mass storage device manufacturers strive to produce high speed hard disk drives with large data capacities at lower and lower costs. A high speed hard disk drive is one that can store and retrieve data at a fast rate. One aspect of increasing disk drive speed and capacity is to improve or increase the areal density. Areal density may be increased by improving the method of storing and retrieving data.

In general, mass storage devices and systems, such as hard disk drives, include a magnetic storage media, such as rotating disks or platters, a spindle motor, read/write heads, an actuator, a pre-amplifier, a read channel, a write channel, a servo controller, and control circuitry to control the operation of the hard disk drive and to properly interface the hard disk drive to a host or system bus. The read channel, write channel, servo controller, and a memory may all be implemented as one integrated circuit that is referred to as a data channel. The control circuitry often includes a microprocessor for executing control programs or instructions during the operation of the hard disk drive.

A hard disk drive (HDD) performs write and read operations when storing and retrieving data. A typical HDD performs a write operation by transferring data from a host interface to its control circuitry. The control circuitry then stores the data in a local dynamic random access memory (DRAM). A control circuitry processor schedules a series of events to allow the information to be transferred to the disk platters through a write channel. The control circuitry moves the read/write heads to the appropriate track and locates the appropriate sector of the track. Finally, the HDD control circuitry transfers the data from the DRAM to the located sector of the disk platter through the write channel. A sector generally has a fixed data storage capacity, such as 512 bytes of user data per sector. A write clock controls the timing of a write operation in the write channel. The write channel may encode the data so that the data can be more reliably retrieved later.

In a read operation, the appropriate sector to be read is located and data that has been previously written to the disk is read. The read/write head senses the changes in the magnetic flux of the disk platter and generates a corresponding analog read signal. The read channel receives the analog read signal, conditions the signal, and detects "zeros" and "ones" from the signal. The read channel conditions the signal by amplifying the signal to an appropriate level using automatic gain control (AGC) techniques. The read channel then filters the signal, to eliminate unwanted high frequency noise, equalizes the channel, detects "zeros" and "ones" from the signal, and formats the binary data for the control circuitry. The binary or digital data is then transferred from the read channel to the control circuitry and is stored in the DRAM of the control circuitry. The processor then communicates to the host that data is ready to be transferred. A read clock controls the timing of a read operation in the read channel.

As the disk platters are moving, the read/write heads must align or stay on a particular track. This is accomplished by reading information from the disk called a servo wedge. Generally, each sector has a corresponding servo wedge. The servo wedge indicates the position of the heads. The data channel receives this position information so the servo controller can continue to properly position the heads on the track.

Traditional HDD data or read channels used a technique known as peak detection for extracting or detecting digital information from the analog information stored on the magnetic media. In this technique, the waveform is level detected and if the waveform level is above a threshold during a sampling window, the data is considered a "one." More recently, advanced techniques utilizing discrete time signal processing (DTSP) to reconstruct the original data written to the disk are being used in read channel electronics to improve areal density. In these techniques, the data is synchronously sampled using a data recovery clock. The sample is then processed through a series of mathematical manipulations using signal processing theory.

There are several types of synchronously sampled data (SSD) channels. Partial response, maximum likelihood (PRML); extended PRML (EPRML); enhanced, extended PRML (EEPRML); fixed delay tree search (FDTS); and decision feedback equalization (DFE) are several examples of different types of SSD channels using DTSP techniques. The maximum likelihood detection performed in many of these systems is usually performed by a Viterbi decoder implementing the Viterbi algorithm, named after Andrew Viterbi who developed it in 1967.

The SSD channel or read channel generally requires mixed-mode circuitry for performing a read operation. The circuitry may perform such functions as analog signal amplification, automatic gain control (AGC), continuous time filtering, signal sampling, DTSP manipulation, timing recovery, signal detection, and formatting. In all SSD channels, the major goal during a read operation is to accurately retrieve the data with the lowest bit error rate (BER) in the highest noise environment. The data channel circuitry, including both a read channel and a write channel, may be implemented on a single integrated circuit package that contains various input and output (I/O) pins.

The viterbi detectors used in SSD channels receive a read signal and perform maximum likelihood detection to detect "zeros" and "ones" from the read signal. A viterbi detector includes a metric circuit and a trellis circuit. The metric circuit performs an add, compare, select, and store function on each discrete value provided by the read signal and provides a transition signal to the trellis circuit in response. In performing its functions, the metric circuit calculates and stores a metric value for each discrete value provided by the read signal. The metric circuit calculates and stores a metric value even when the metric value has not changed. This introduces additional noise into the circuitry. The trellis circuit receives the transition signal and performs sequence decoding to provide a digital output signal. The trellis circuit acts as a logic tree or decision tree for sequence decoding.

Depending on the partial response or characteristic desired in an SSD channel, the SSD channel may require two viterbi detectors to process the read signal. In such a channel, the read signal is deinterleaved into an even and an odd interleave signal and each interleave signal is analyzed by a separate viterbi detector. The read signal is deinterleaved by sampling the signal at alternating intervals to provide the odd and even interleave signal. For example, if the SSD channel is implemented as a partial response, class IV (PR4) or duobinary, dicode read channel, two viterbi detectors are needed to process the read signal. When two viterbi detectors are needed, the SSD channel includes two metric circuits and two trellis circuits. This additional circuitry increases overall fabrication costs and increases overall power consumption which becomes especially critical in portable electronic applications such as laptop or notebook computers.

SUMMARY OF THE INVENTION

From the foregoing it may be appreciated that a need has arisen for a metric circuit and method for use in a viterbi detector. In accordance with the present invention, a metric circuit and method are provided that allow a single metric circuit to replace two metric circuits in a viterbi detector. The single metric circuit is used in a viterbi detector to provide a transition signal to two trellis circuits. In performing its functions, the single metric circuit does not store a new metric value when the metric value has not changed. This eliminates the introduction of added noise into the metric circuit.

According to the present invention, a metric circuit for use in a viterbi detector is provided that provides a transition signal during a first period and during a second period. The transition signal may be provided to an odd trellis circuit during the first period and to an even trellis circuit during the second period. The transition signal is provided as a positive and a negative transition signal. The metric circuit includes a first and a second adder circuit, a first and a second comparator, an odd sample/hold circuit, and an even sample/hold circuit. The metric circuit receives a discrete signal and a threshold value at the first and second adder circuits. The first adder circuit generates a first sum and the second adder circuit generates a second sum. During the first period, the first sum is compared to an odd metric value using the first comparator and the second sum is compared to the odd metric value using the second comparator to generate a negative transition signal and a positive transition signal respectively. During the second period, the first sum is compared to an even metric value using the first comparator and the second sum is compared to the even metric value using the second comparator to generate a negative transition signal and a positive transition signal respectively. The odd sample/hold circuit stores and provides the odd metric value during the first period. The even sample/hold circuit stores and provides the even metric value during the second period. The value of the odd metric and the even metric are replaced with either the first sum or the second sum only when specified conditions are met.

The present invention provides various technical advantages. A technical advantage of the present invention includes an overall reduction in circuitry which reduces fabrication costs and reduces overall power consumption. Another technical advantage of the present invention includes a reduction in system noise which enhances system performance. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which.

DETAILED DESCRIPTION OF THE INVENTION

Figure 1:
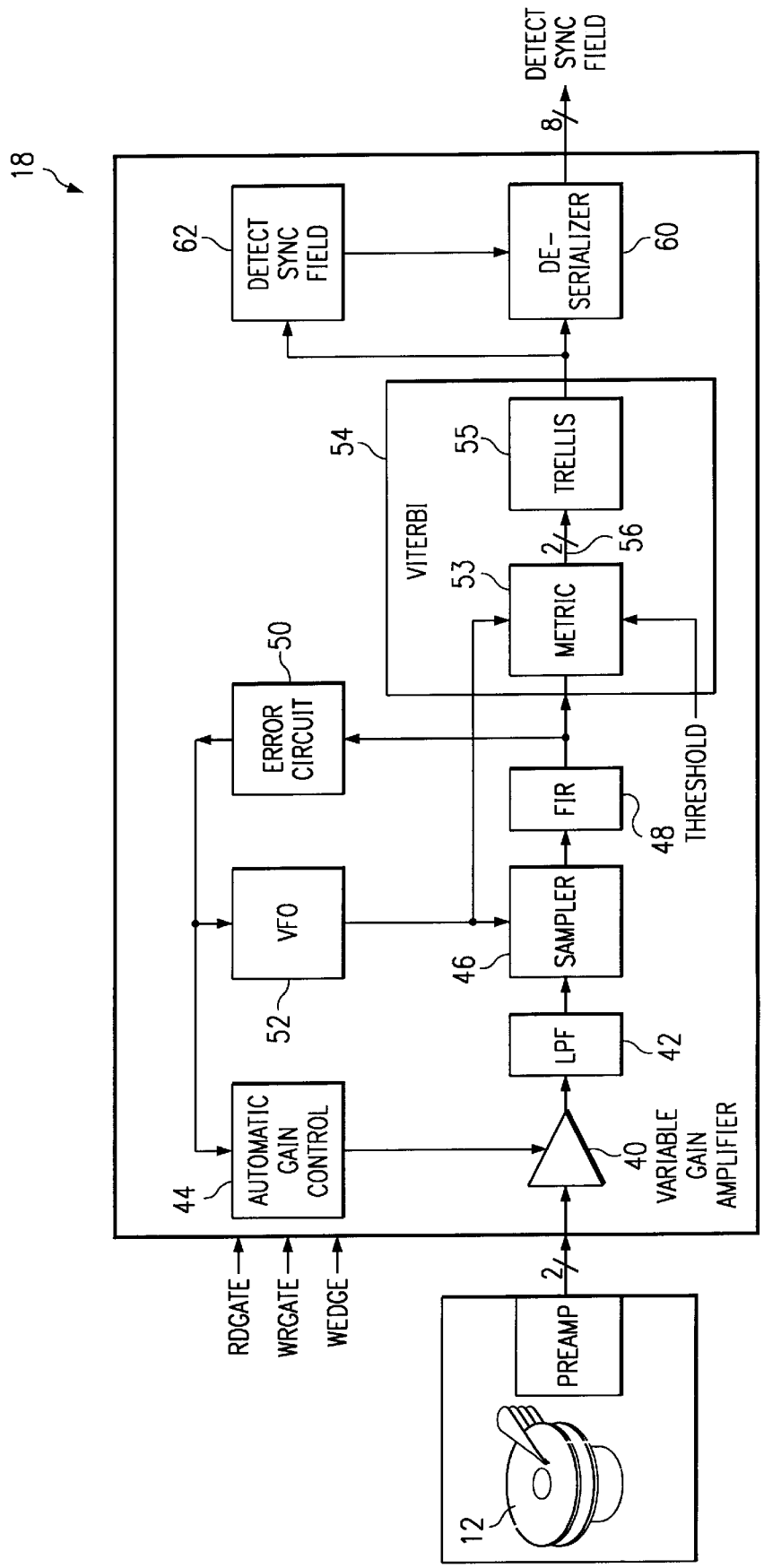
FIG. 1 is a block diagram illustrating a read channel of a disk drive mass storage system.

FIG. 1 is a block diagram of read channel 18 of a disk drive mass storage system. Read channel 18 is a synchronously sampled read channel and is implemented as a partial response, class IV (PR4) or duobinary, dicode read channel. Read channel 18 includes a variety of circuit modules used to process and condition an analog read signal received from a disk/head assembly 12 through a preamplifier during a read operation. The circuit modules of read channel 18 include a variable gain amplifier (VGA) 40, an automatic gain control circuit (AGC) 44, a low pass filter (LPF) 42, a sampler 46, a finite impulse response filter (FIR) 48, an error circuit 50, a variable frequency oscillator (VFO) 52, a viterbi detector 54, a synchronization detect circuit (sync detect) 62, and a deserializer 60. All of these circuit modules are used during a read operation to perform various functions to condition the analog read signal so that a corresponding and correct digital data signal is provided. The digital data signal may then be supplied to control circuitry, external to read channel 18, and ultimately to a host system.

The combination or subcombination of all of the circuit modules of read channel 18 may be referred to as a read channel processing circuit. The signals RDGATE, WRGATE, and WEDGE of FIG. 1, and other control signals not shown in FIG. 1, are supplied to read channel 18 and may be accessed by the various circuit modules of read channel 18 as needed. A read operation is performed in read channel 18 when the RDGATE signal is enabled. The WRGATE is enabled when a write operation is to be performed by a write channel, and the WEDGE signal is enabled when a servo wedge operation is to be performed by servo circuitry.

During a read operation, VGA 40 receives an analog data signal or read signal from the preamplifier that originates from disk/head assembly 12. VGA 40, along with AGC 44, work together to provide an appropriate amplification to the analog data signal as needed by read channel 18. AGC 44 receives feedback information from error circuit 50 so that appropriate adjustments can be made in the amplification or gain provided to the analog data signal by VGA 40. Error circuit 50 provides an analog error signal to AGC 44 during sampled or discrete time signal processing. This analog error signal serves as an input to AGC 44 to assist with establishing the gain of VGA 40.

VGA 40 provides an amplified analog data signal to LPF 42 for further processing in read channel 18. LPF 42 receives the amplified analog data signal and filters the signal to remove unwanted high frequency noise. LPF 42 also provides waveform shaping and amplitude boost. LPF 42 may be a continuous time 7th order filter designed using Gm/C components that may be operated in a data mode and a servo mode. The cutoff frequency and boost of LPF 42 may be programmable. The filtered output signal of LPF 42 is provided to sampler 46.

Sampler 46 receives the filtered output signal and synchronously samples the continuous time signal at discrete times and holds or provides the sampled value until the next sample time. VFO 52 controls sampler 46 by providing a clock signal indicating when sampler 46 should sample and hold the signal. The output of sampler 46 is a discrete, analog signal having discrete values. Each discrete value corresponds to the value or amplitude of the filtered output signal at the time the signal was sampled by sampler 46. Sampler 46 may be a sample and hold circuit such as a circular sample and hold circuit that is time sequence multiplexed to FIR 48 so that the correct time sequenced value is presented to FIR 48.

FIR 48 receives the discrete, analog signal from sampler 46 and generates a discrete, equalized signal that is equalized to the target function of viterbi detector 54. FIR 48 may employ a plurality of filter coefficients or taps to filter the signal. FIR 48 includes a plurality of multipliers that each receive one of the filter coefficients and a consecutive one of the discrete values provided from the discrete, analog signal of sampler 46. The outputs of each of the multipliers are then provided to an adder, such as an analog adder circuit, which sums these values and serves as the output of FIR 48. As the discrete, analog input signal changes, the consecutive one of the discrete values are shifted from one multiplier to the next multiplier so that the first multiplier receives the latest discrete value and the last multiplier drops the oldest discrete value and receives the next oldest discrete value.

FIR 48 may be a five tap filter with coefficients set by programmable digital circuitry. For example, FIR 48 may receive five digital coefficients or filter tap weights that are converted to an analog value through a digital-to-analog converter. Each coefficient is then provided to a separate multiplier. Each multiplier receives a successive one of the discrete values of the discrete, analog signal provided by sampler 46. The outputs of all five of the multipliers are provided to an analog adder circuit which provides the discrete, equalized signal as the output of FIR 48. The number of coefficients or taps and corresponding multipliers may vary. FIR 48 provides the discrete, equalized signal to viterbi detector 54 and error circuit 50.

Error circuit 50 receives the discrete, equalized signal provided by FIR 48 and provides an error signal. The error signal serves as an input to VFO 52 and AGC 44. The error signal indicates how far the discrete values of the discrete, equalized signal differ from an ideal target value. Error circuit 50 may include comparators and storage registers to compare the discrete values of the discrete, equalized signal to various ideal target values and threshold values. The target values and threshold values, not shown in FIG. 1, are provided to error circuit 50.

VFO 52 receives the error signal from error circuit 50 during a read operation and generates a clock signal that is provided throughout read channel 18. As illustrated in FIG. 1, sampler 46 and metric circuit 53 of viterbi detector 54 receive the clock signal from VFO 52. VFO 52 also receives a reference clock signal, not shown in FIG. 1, to generate the clock signal. The clock signal controls the sample time or sample intervals of sampler 46 and serves as a timing signal to metric circuit 53. During a read operation, VFO 52 receives the error signal and adjusts the frequency of its output clock signal an amount corresponding to the error signal. VFO 52, sampler 46, FIR 48, and error circuit 50 together provide a sampled time phase locked loop function to read channel 18. Although not expressly shown in FIG. 1, the clock signal may be provided to any of the circuit modules of read channel 18 that need the clock signal for synchronous operation. For example, the comparators and storage registers used in error circuit 50 may use the clock signal from VFO 52 to synchronize their operation.

Viterbi detector 54 is a maximum likelihood detector or Viterbi decoder implementing the Viterbi algorithm for analyzing the partial response signal provided by the discrete, equalized signal of FIR 48. Viterbi detector 54 generates a digital data output signal in response. In performing maximum likelihood detection, the viterbi algorithm provides an iterative method for determining the best path along branches of a trellis diagram. The maximum likelihood detection involves analyzing a number of consecutive data samples to determine the most likely path. Thus, by analyzing a number of consecutive samples, the most likely sequence can be chosen. Viterbi detector 54 includes a metric circuit 53 and a trellis block 55 containing an even and odd trellis circuit.

As discussed above, synchronously sampled read channel 18 is implemented as a partial response, class IV (PR4) or duobinary, dicode read channel. In a PR4 system, the discrete, equalized signal, provided by FIR 48 to viterbi detector 54, is. deinterleaved into an even and an odd interleave signal. The even and odd interleave signal are generated by alternately providing each discrete value of the discrete, equalized signal so that the odd interleave signal includes every other discrete value and the even interleave signal includes the remaining discrete values. Each interleave signal is analyzed separately by viterbi detector 54 and then recombined into one digital data output signal.

Metric circuit 53 alternately analyzes the even interleave signal and the odd interleave signal and provides a two-bit transition signal 56 in response. Transition signal 56 includes a negative transition signal and a positive transition signal. Transition signal 56 alternately provides a transition signal for the odd interleave signal and then for the even interleave signal. Trellis block 55 includes an even trellis circuit and an odd trellis circuit that each receive the corresponding transition signal from metric circuit 53. Trellis block 55 ultimately provides the digital data output signal.

Metric circuit 53 receives the discrete, equalized signal from FIR 48, the clock signal from VFO 52, and threshold value and provides transition signal 56 in response. Metric circuit 53 includes add, compare, select, and store circuitry (ACSS) used to analyze the discrete values of the odd interleave signal, the even interleave signal, and the threshold value. Metric circuit 53 is illustrated more fully in FIG. 2 and discussed more fully below.

Trellis block 55 receives transition signal 56 and provides the digital data output signal. The odd trellis circuit receives transition signal 56 as a result of metric circuit 53 analyzing the odd interleave signal and the even trellis circuit receives transition signal 56 as a result of metric circuit 53 analyzing the even interleave signal. Trellis block 55 includes trellis circuit enabling circuits, such as two AND gates, that alternate enabling the odd trellis circuit and the even trellis circuit so that each trellis circuit will receive the appropriate transition signal 56. The odd and even trellis circuits act as logic trees or decision trees for sequence decoding of transition signal 56. The digital output signals of the odd and even trellis circuits are interleaved or recombined to produce one digital data output signal which serves as the digital data output signal of viterbi detector 54. Trellis block 55 may be implemented using a variety of circuitry such as a series of flip-flops for storing a series of the values provided by transition signal 56.

Sync detect 62 receives the digital data output signal from viterbi 54 and provides a synchronization detect signal. Sync detect 62 searches for the presence of a synchronization field or synchronization byte in the digital data output signal and enables the synchronization detect signal when a synchronization field is detected. Sync detect 62 may search for the synchronization field over a predefined period or "window" of time that the synchronization field should be present. Sync detect 62 may include a register for storing a predefined synchronization field and digital logic circuitry to compare the digital data output to the predefined synchronization field.

Deserializer 60 receives the digital data output signal from viterbi detector 54 and provides the digital data output signal in parallel format once sync detect 62 enables the synchronization detect signal. Deserializer 60 places the digital data in an appropriate parallel format such as an eight or nine-bit format and provides the data external to read channel 18.

In operation, read channel 18 receives an analog data signal from disk/head assembly 12 through the preamplifier when the RDGATE signal is enabled. The enabling of the RDGATE signal indicates that a read operation is to be performed in read channel 18. VGA 40 receives the analog data signal and provides appropriate gain or boost to the analog data signal which is then filtered by LPF 42. AGC 44 provides a gain signal to VGA 40 to establish the appropriate amplification or gain needed by read channel 18. AGC 44 receives feedback information from error circuit 50 so that appropriate adjustments can be made in the amplification or gain provided to the analog data signal by VGA 40.

Sampler 46, under the control of VFO 52, receives the output signal provided by LPF 42 and synchronously samples this signal. Sampler 46 provides a discrete, analog signal to FIR 48. FIR 48 further conditions and equalizes the signal and provides a discrete, equalized signal having the desired channel response of read channel 18. Viterbi detector 54 receives the discrete, equalized signal and analyzes the signal and provides a digital data output signal. Deserializer 60 receives the digital data output signal and provides the digital data output signal in parallel format once sync detect 62 enables the synchronization detect signal.

Figure 2:
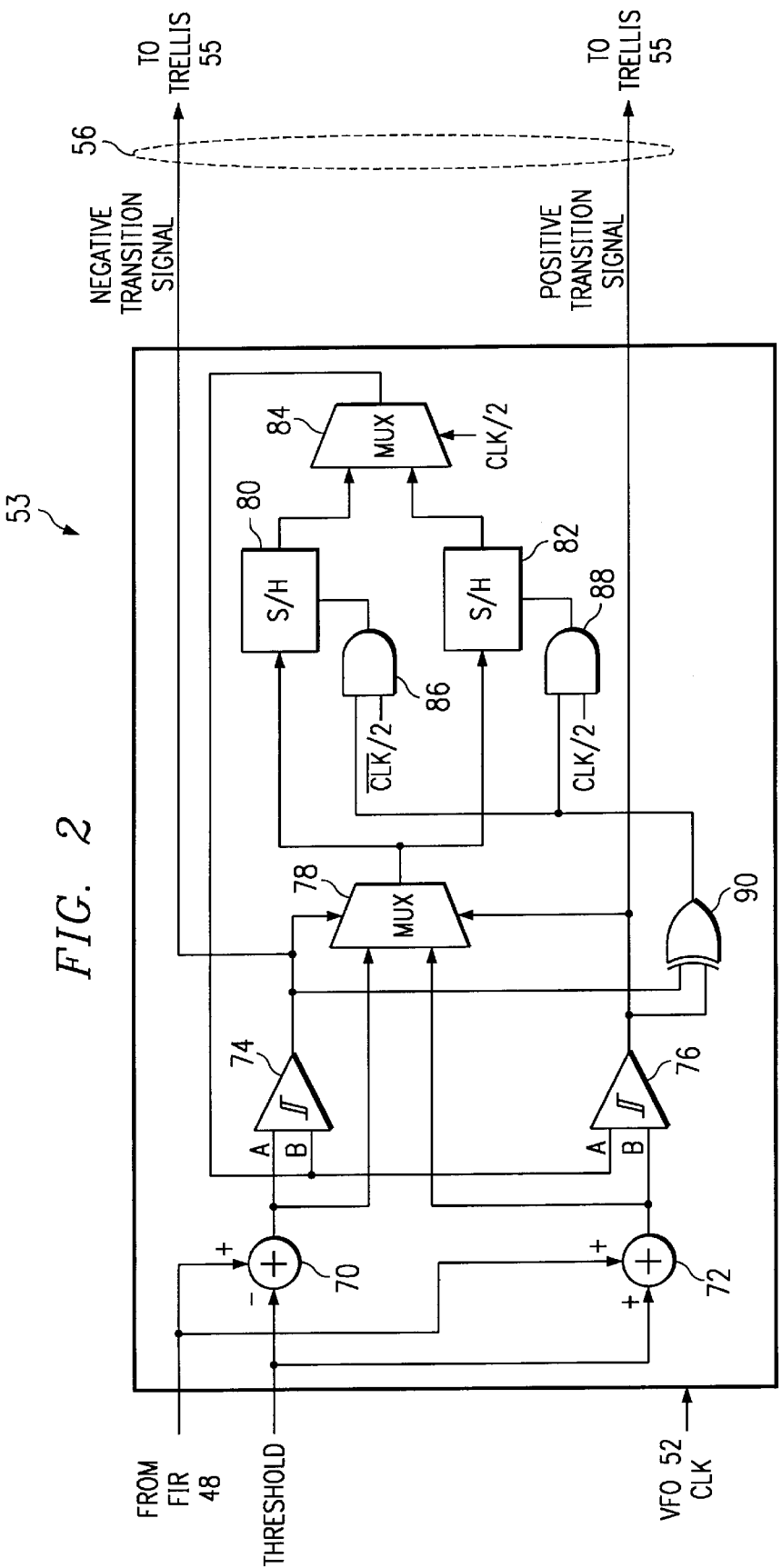
FIG. 2 is a block diagram illustrating a metric circuit of a viterbi detector used in the read channel.

FIG. 2 is a block diagram illustrating metric circuit 53 of viterbi detector 54. Metric circuit 53 receives the discrete, equalized signal from FIR 48, the clock signal from VFO 52, and a threshold value. In response, metric circuit 53 generates a transition signal 56 for each discrete, equalized value. Transition signal 56 is provided as a two-bit signal and includes a negative transition signal and a positive transition signal. Transition signal 56 is provided over alternating first periods and second periods.

The first period corresponds to an odd interleave signal and the second period corresponds to an even interleave signal as discussed above. For example, during a first period, a discrete input value is analyzed and a corresponding transition signal is provided, and then, during a second period, the next discrete input value is analyzed and a corresponding transition signal is provided. The process continues so that every other discrete value of the discrete, equalized signal is analyzed by metric circuit 53 during a first period. The remaining discrete values are analyzed during a second period. Each period may be equivalent to every clock cycle or every half clock cycle as provided by the clock signal of VFO 52. Metric circuit 53, in effect, deinterleaves the discrete, equalized signal into an odd interleave signal and an even interleave signal that are analyzed during a first period and a second period respectively.

Metric circuit 53 includes a first adder circuit 70 and a second adder circuit 72 that each receive the discrete, equalized signal and the threshold value. The threshold value may be one value or multiple values that are programmable. First adder circuit 70 subtracts the threshold value from the value of the discrete, equalized signal to generate a first sum. Second adder circuit 72 adds the threshold value to the value of the discrete, equalized signal to generate a second sum.

The first sum is provided as an input to a first comparator 74, and the second sum is provided as an input to a second comparator 76. First comparator 74 and second comparator 76 compare these inputs to a metric value and provide an output signal indicating which of the two input signals is larger. During a first period, an odd sample/hold circuit 80 provides an odd metric value to the two comparators. During a second period, an even sample/hold circuit 82 provides an even metric value to the two comparators. The reference to an "odd" and "even" metric value does not refer to whether the metric values are odd or even numbers but instead refer to the analysis of the odd and even interleave signals.

The output signal generated as a result of the comparisons performed by first comparator 74 and second comparator 76 serve as transition signal 56. The output of first comparator 74 serves as the negative transition signal and the output of second comparator 76 serves as the positive transition signal. The negative transition signal is equal to a digital "one" value when the first sum is greater than the metric value and a digital "zero" value when it is not. The positive transition signal is equal to a digital "one" value when the metric value is greater than the second sum and a digital "zero" value when it is not. The negative transition signal and the positive transition signal should not both be equal to one at the same time. The timing of each of these comparisons are controlled by the clock signal provided by VFO 52. The negative transition signal and positive transition signal also serve as control signals to a first multiplexer 78 and as inputs to an exclusive OR gate 90.

First multiplexer 78 receives the first sum and the second sum as inputs and may provide one of these inputs as an output depending on the negative transition signal and the positive transition signal. Whenever the negative transition signal is equal to one, the first sum is provided by first multiplexer 78 as an output. Whenever the positive transition signal is equal to one, the second sum is provided by first multiplexer 78 as an output. When neither the negative transition signal or the positive transition signal are equal to one, first multiplexer 78 does not provide either as an output.

The output of first multiplexer 78 is provided to and stored in odd sample/hold circuit 80 during the first period and provided to and stored in even sample/hold circuit 82 during the second period. These values serve as the odd metric value and the even metric value respectively.

An odd sample/hold enable circuit 86, an even sample/hold enable circuit 88, and an exclusive OR gate 90 together serve as selection circuitry to ensure that the output of first multiplexer 78 is correctly provided to either odd sample/hold circuit 80 or even sample/hold circuit 82. Exclusive OR gate 90 performs an Exclusive-OR function on the negative transition signal and the positive transition signal. The output of exclusive OR gate 90 is enabled when either the negative transition signal or the positive transition signal is equal to one but not when neither or both of them are equal to one. This ensures that the sample/hold circuits are updated with a new metric value only when either the negative transition signal or the positive transition signal is equal to one but not when neither or both of them are equal to one.

Odd sample/hold enable circuit 86 is an AND gate that enables odd sample/hold circuit 80 to receive and store a new odd metric value from first multiplexer 78 when specified conditions are met. Odd sample/hold enable circuit 86 receives a clock signal input that is enabled during the first period and the output of exclusive OR gate 90. Therefore, odd sample/hold circuit 80 stores a new odd metric value to replace the current odd metric value during the first period and when either the negative transition signal or the positive transition is equal to one but not when neither or both of them are equal to one.

Even sample/hold enable circuit 88 is an AND gate that enables even sample/hold circuit 82 to receive and store a new even metric value from first multiplexer 78 when specified conditions are met. Even sample/hold enable circuit 88 receives a clock signal input that is enabled during the second period and the output of exclusive OR gate 90. Therefore, even sample/hold circuit 82 stores a new even metric value to replace the current even metric value during the second period and when either the negative transition signal or the positive transition is equal to one but not when neither or both of them are equal to one.

Finally, second multiplexer 84 receives the odd metric value from odd sample/hold circuit 80 and the even metric value from even sample/hold circuit 82 as inputs and provides one of these as an output. During the first period, the odd metric value is provided to first comparator 74 and second comparator 76, and during the second period, the even metric value is provided to first comparator 74 and second comparator 76. A clock signal provided by VFO 52 serves as a control signal to second multiplexer 84 to determine the first period and the second period.

Thus, it is apparent that there has been provided, in accordance with the present invention, a metric circuit and method for use in a viterbi detector that satisfies the advantages set forth above. Although the preferred embodiment has been described in detail, it should be understood that various changes, substitutions, and alterations can be made herein. For example, a variety of different circuitry could be implemented in the metric circuit to perform the novel features of the present invention. The metric circuitry could be implemented as all digital circuitry. The threshold values provided to first adder circuit 70 and second adder circuit 72 of metric circuit 53 could be provided at a negative and a positive value or could be provided at one value and subtracted by first adder circuit 70. Also, the direct connections illustrated herein could be altered by one skilled in the art such that two devices are merely coupled to one another through an intermediate device or devices without being directly connected while still achieving the desired results demonstrated by the present invention. Other examples of changes, substitutions, and alterations are readily ascertainable by one skilled in the art and could be made without departing from the spirit and scope of the present invention. While the invention has been particularly shown and described by the foregoing detailed description, it will be understood by those skilled in the art that various other changes in form and detail may be made without departing from the spirit and scope of the invention as defined by the following claims.

What is claimed is:

1. A metric circuit comprising:
   a first adder circuit operable to subtract a threshold value from a discrete signal and to generate a first sum signal in response;
   a second added circuit operable to add the threshold value to the discrete signal and to generate a second sum signal in response;
   a first comparator operable to compare the first sum signal and an odd metric value during a first period and to generate a negative transition signal in response to the comparison, the first comparator operable to compare the first sum signal and an even metric value during a second period and to generate the negative transition signal in response;
   a second comparator operable to compare the second sum signal and the odd metric value during the first period and to generate a positive transition signal in response to the comparison, the second comparator operable to compare the second sum signal and the even metric value during the second period and to generate the positive transition signal in response;
   an odd sample/hold circuit operable to store the odd metric value and to provide the odd metric value during the first period, the odd sample/hold circuit operable to replace the odd metric value during the first period with the value of the first sum signal if the first sum signal is greater than the odd metric value as indicated by the negative transition signal, the odd sample/hold circuit operable to replace the odd metric value during the first period with the value of the second sum signal if the second sum signal is less than the odd metric value as indicated by the positive transition signal; and
   an even sample/hold circuit operable to store the even metric value and to provide the even metric value during the second period, the even sample/hold circuit operable to replace the even metric value during the second period with the value of the second sum signal if the negative transition signal indicates that the second sum signal is greater than the current even metric value, the even sample/hold circuit operable to replace the even metric value during the second period with the value of the second sum signal if the positive transition signal indicates that the second sum signal is less than the current even metric value, the metric circuit further comprising:
   a first multiplexer operable to provide either the first sum signal or the second sum signal to the odd sample/hold circuit during the first period, the first multiplexer operable to provide either the first sum signal or the second sum signal to the even sample/hold circuit during the second period.

2. The metric circuit of claim 1 wherein the threshold value is a programmable value.

3. The metric circuit of claim 1 wherein the threshold value provided to the first adder circuit is provided at a negative value and the threshold value provided to the second adder circuit is provided at a positive value.

4. The metric circuit of claim 3 wherein the threshold values are programmable values.

5. The metric circuit of claim 1 wherein the first multiplexer is controlled by the negative transition signal and the positive transition signal.

6. The metric circuit of claim 5 wherein the first multiplexer provides the first sum if the negative transition signal indicates that the first sum signal is greater than the odd metric value during the first period, the first multiplexer provides the second sum if the positive transition signal indicates that the second sum is less than the odd metric value during the first period, the first multiplexer provides the first sum if the negative transition signal indicates that the first sum signal is greater than the even metric value during the second period, the first multiplexer provides the second sum if the positive transition signal indicates that the second sum is less than the even metric value during the second period.

7. A metric circuit comprising:
  a first adder circuit operable to subtract a threshold value from a discrete signal and to generate a first sum signal in response;
  a second added circuit operable to add the threshold value to the discrete signal and to generate a second sum signal in response;
  a first comparator operable to compare the first sum signal and an odd metric value during a first period and to generate a negative transition signal in response to the comparison, the first comparator operable to compare the first sum signal and an even metric value during a second period and to generate the negative transition signal in response;
  a second comparator operable to compare the second sum signal and the odd metric value during the first period and to generate a positive transition signal in response to the comparison, the second comparator operable to compare the second sum signal and the even metric value during the second period and to generate the positive transition signal in response;
  an odd sample/hold circuit operable to store the odd metric value and to provide the odd metric value during the first period, the odd sample/hold circuit operable to replace the odd metric valuie during the first period with the value of the first sum signal if the first sum signal is greater than the odd metric value as indicated by the negative transition signal, the odd sample/hold circuit operable to replace the odd metric value during the first period with the value of the second sum signal if the second sum signal is less than the odd metric value as indicated by the positive transition signal; and
  an even sample/hold circuit operable to store the even metric value and to provide the even metric value during the second period, the even sample/hold circuit operable to replace the even metric value during the second period with the value of the second sum signal if the negative transition signal indicates that the second sum signal is greater than the current even metric value, the even sample/hold circuit operable to replace the even metric value during the second period with the value of the second sum signal if the positive transition signal indicates that the second sum signal is less than the current even metric value, the metric circuit further comprising:
    a second multiplexer operable to receive the odd metric value and the even metric value, the second multiplexer operable to provide the odd metric value to the first comparator circuit and the second comparator circuit during the first period, the second multiplexer operable to provide the even metric value to the first comparator circuit and the second comparator circuit during the second period.

8. A metric circuit comprising:
  a first adder circuit operable to subtract a threshold value from a discrete signal and to generate a first sum signal in response;
  a second added circuit operable to add the threshold value to the discrete signal and to generate a second sum signal in response;
  a first comparator operable to compare the first sum signal and an odd metric value during a first period and to generate a negative transition signal in response to the comparison, the first comparator operable to compare the first sum signal and an even metric value during a second period and to generate the negative transition signal in response;
  a second comparator operable to compare the second sum signal and the odd metric value during the first period and to generate a positive transition signal in response to the comparison, the second comparator operable to compare the second sum signal and the even metric value during the second period and to generate the positive transition signal in response;
  an odd sample/hold circuit operable to store the odd metric value and to provide the odd metric value during the first period, the odd sample/hold circuit operable to replace the odd metric value during the first period with the value of the first sum signal if the first sum signal is greater than the odd metric value as indicated by the negative transition signal, the odd sample/hold circuit operable to replace the odd metric value during the first period with the value of the second sum signal if the second sum signal is less than the odd metric value as indicated by the positive transition signal; and
  an even sample/hold circuit operable to store the even metric value and to provide the even metric value during the second period, the even sample/hold circuit operable to replace the even metric value during the second period with the value of the second sum signal if the negative transition signal indicates that the second sum signal is greater than the current even metric value, the even sample/hold circuit operable to replace the even metric value during the second period with the value of the second sum signal if the positive transition signal indicates that the second sum signal is less than the current even metric value,
  wherein the negative transition signal and the positive transition signal are provided to an odd trellis circuit during the first period and to an even trellis circuit during the second period.

9. A metric circuit comprising:
  a first adder circuit operable to subtract a threshold value from a discrete signal and to generate a first sum signal in response;
  a second added circuit operable to add the threshold value to the discrete signal and to generate a second sum signal in response;
  a first comparator operable to compare the first sum signal and an odd metric value during a first period and to generate a negative transition signal in response to the comparison, the first comparator operable to compare the first sum signal and an even metric value during a second period and to generate the negative transition signal in response;

a second comparator operable to compare the second sum signal and the odd metric value during the first period and to generate a positive transition signal in response to the comparison, the second comparator operable to compare the second sum signal and the even metric value during the second period and to generate the positive transition signal in response;

an odd sample/hold circuit operable to store the odd metric value and to provide the odd metric value during the first period, the odd sample/hold circuit operable to replace the odd metric value during the first period with the value of the first sum signal if the first sum signal is greater than the odd metric value as indicated by the negative transition signal, the odd sample/hold circuit operable to replace the odd metric value during the first period with the value of the second sum signal if the second sum signal is less than the odd metric value as indicated by the positive transition signal; and an even sample/hold circuit operable to store the even metric value and to provide the even metric value during the second period, the even sample/hold circuit operable to replace the even metric value during the second period with the value of the second sum signal if the negative transition signal indicates that the second sum signal is greater than the current even metric value, the even sample/hold circuit operable to replace the even metric value during the second period with the value of the second sum signal if the positive transition signal indicates that the second sum signal is less than the current even metric value, the metric circuit further comprising:

a selection circuitry operable to enable the odd sample/hold circuit to replace the odd metric value during the first period with the value of the first sum signal when the negative transition signal indicates that the first sum signal is greater than the current odd metric value and the positive transition signal indicates that the second sum signal is greater than the current odd metric value, the selection circuitry operable to enable the odd sample/hold circuit to replace the odd metric value during the first period with the value of the second sum signal when the negative transition signal indicates that the first sum signal is less than the current odd metric value and the positive transition signal indicates that the second sum signal is less than the current odd metric value, the selection circuitry operable to enable the even sample/hold circuit to replace the even metric value during the second period with the value of first sum signal when the negative transition signal indicates that the first sum signal is greater than the current even metric value and the positive transition signal indicates that the second sum signal is greater than the current even metric value, the selection circuitry operable to enable the even sample/hold circuit to replace the even metric value during the second period with the value of the second sum signal when the negative transition signal indicates that the first sum signal is less than the current even metric value and the positive transition signal indicates that the second sum signal is less than the current even metric value.

10. A method for generating a transition signal in a metric circuit comprising the steps of:

receiving a first discrete value;

generating a first sum during a first period by subtracting a threshold value from the first discrete value;

generating a second sum during the first period by adding a threshold value to the first discrete value;

generating a transition signal during the first period by comparing the first sum to an odd metric value and the second sum to the odd metric value;

receiving a second discrete value;

generating a first sum during a second period by subtracting a threshold value from the second discrete value;

generating a second sum during the second period by adding a threshold value to the second discrete value;

generating a transition signal during the second period by comparing the first sum to an even metric value and the second sum to the even metric value;

replacing the odd metric value during the first period with the value of the first sum if the first sum is greater than the odd metric value and the second sum is greater than the odd metric value;

replacing the odd metric value during the first period with the value of the second sum if the second sum is less than the odd metric value and the first sum is less than the odd metric value;

replacing the even metric value during the second period with the value of the first sum if the first sum is greater than the even metric value and the second sum is greater than the even metric value; and replacing the even metric value during the second period with the value of the second sum if the second sum is less than the even metric value and the first sum is less than the even metric value.

11. The method of claim 10 wherein the transition signal includes a negative transition signal as a result of the comparison of the first sum, and a positive transition signal as a result of the comparison of the second sum.

12. The method of claim 10 wherein the generating a transition signal during the first period step and the generating a transition signal during the second period step include generating a negative transition signal by comparing the first sum to the metric value, and generating a positive transition signal by comparing the second sum to the metric value.

13. The method of claim 10 wherein the generating a first sum during a first period step and the generating a first sum during a second period step include adding a negative threshold value to the discrete value.

14. A method comprising the steps of:

subtracting a threshold value from a discrete signal and to generate a first sum signal in response;

adding the threshold value to the discrete signal and to generate a second sum signal in response;

comparing the first sum signal and an odd metric value during a first period and to generate a negative transition signal in response to the comparison and comparing the first sum signal and an even metric value during a second period and to generate the negative transition signal in response;

comparing the second sum signal and the odd metric value during the first period and to generate a positive transition signal in response to the comparison and comparing the second sum signal and the even metric value during the second period and to generate the positive transition signal in response;

storing the odd metric value and providing the odd metric value during the first period, updating the odd metric value during the first period with the value of the first sum signal if the first sum signal is greater than the odd metric value as indicated by the negative transition signal, the odd sample/hold circuit operable to update the odd metric value during the first period with the value of the second sum signal if the second sum signal is less than the odd metric value as indicated by the positive transition signal; and storing the even metric value and providing the even metric value during the second period, updating the even metric value during the second period with the value of the second sum signal if the negative transition signal indicates that the second sum signal is greater than the current even metric value, updating the even metric value during the second period with the value of the second sum signal if the positive transition signal indicates that the second sum signal is less than the current even metric value.

15. The method of claim 14 wherein the threshold value is a programmable value.

16. The method of claim 14 wherein the threshold value is a negative value and the threshold value is a positive value.

17. The method of claim 16 wherein the threshold values are programmable values.

* * * * *